United States Patent [19]

Barenboim et al.

[11] Patent Number: 5,778,527
[45] Date of Patent: Jul. 14, 1998

[54] APPARATUS AND METHOD FOR FORMING "L"-SHAPED TERMINALS FROM STRUCTURES STAMPED IN A FLAT STRIP AND FOR INSERTING SUCH TERMINALS INTO AN ELECTRONIC PACKAGE

[75] Inventors: Michael Barenboim; Mark Edward Mino; John Lennon Sullivan, Jr.; Kenneth Wayne Watts, all of Boca Raton, Fla.

[73] Assignee: International Business Machines Corporation, Armonk, N.Y.

[21] Appl. No.: 707,100

[22] Filed: Sep. 3, 1996

[51] Int. Cl.$^6$ .......................... H01R 43/16; H01R 43/20; H05K 3/30; H05K 13/04
[52] U.S. Cl. .......................... 29/845; 29/566.2; 29/566.3; 29/741; 29/827; 29/837; 29/882; 29/884
[58] Field of Search .................. 29/564.6, 566.2, 29/566.3, 741, 837, 838, 844, 845, 882, 884; 72/341; 227/80, 97, 136

[56] References Cited

U.S. PATENT DOCUMENTS

| | | | |
|---|---|---|---|
| 3,550,250 | 12/1970 | Cervenka et al. | 29/837 X |
| 4,176,448 | 12/1979 | Zahn et al. | 29/837 |
| 4,398,628 | 8/1983 | Chisholm | 29/845 X |
| 4,417,396 | 11/1983 | Ammon et al. | 29/845 X |
| 4,503,610 | 3/1985 | Resch | 29/845 |
| 4,543,714 | 10/1985 | Seffernick et al. | 29/845 |
| 4,598,471 | 7/1986 | Elsbree, Jr. et al. | 28/845 |
| 4,807,357 | 2/1989 | Zahn | 29/845 |
| 5,116,237 | 5/1992 | Loewen | 29/845 X |
| 5,499,443 | 3/1996 | Ota et al. | 29/741 |

FOREIGN PATENT DOCUMENTS

| | | | |
|---|---|---|---|
| 3810975 | 10/1989 | Germany | 29/845 |
| 6216593 | 8/1994 | Japan | 29/838 |

OTHER PUBLICATIONS

Vernon Brown, Proceeding of the 28th Electronic Components Conference, Anaheim CA, USA, Apr. 24–26, 1978, pp. 121–128.

*Primary Examiner*—Peter Vo
*Attorney, Agent, or Firm*—Richard A. Tomlin; Ronald V. Davidge

[57] ABSTRACT

A method is provided for processing a number of "L"-shaped sections within a flat strip to form terminals extending from a component. In the strip, these sections are attached to a web by connecting portions. A number of such sections are simultaneously processed within various stations through which the strip is incrementally fed. These connecting portions are first twisted, so that each "L"-shaped section in the number of such sections extends in a plane perpendicular to the web. Next, these connecting portions are deflected so that outward extending legs of the sections extend in a direction needed for insertion into an electronic component structure. Then, these connecting portions are sheared, as each "L"-shaped section separated from the strip is placed in a slot within a receptacle block. Then, the receptacle block is slid to insert the "L"-shaped sections.

24 Claims, 8 Drawing Sheets

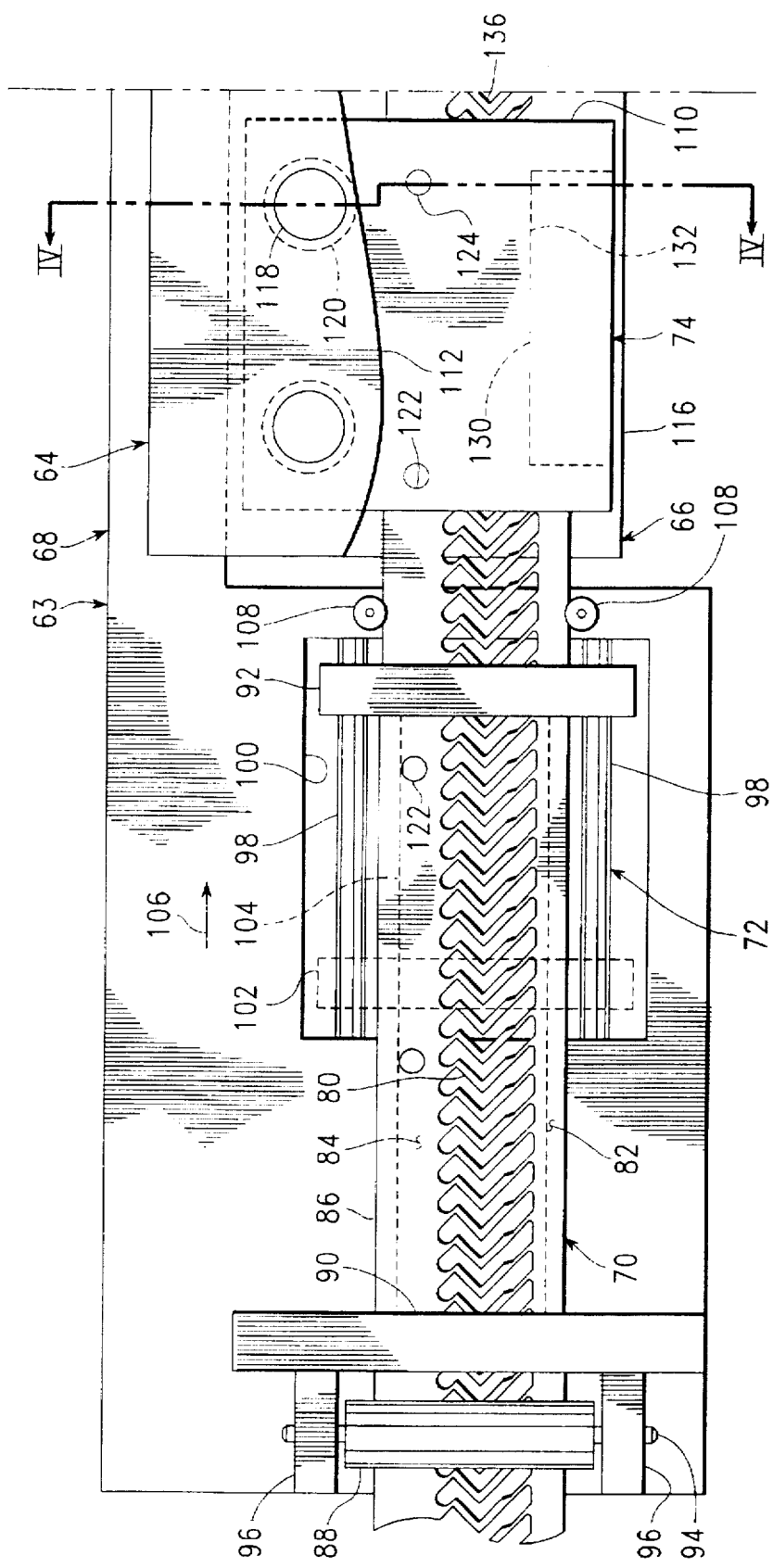

APPARATUS AND METHOD FOR FORMING "L"-SHAPED TERMINALS FROM STRUCTURES STAMPED IN A FLAT STRIP AND FOR INSERTING SUCH TERMINALS INTO AN ELECTRONIC PACKAGE

BACKGROUND OF THE INVENTION

1. Field of the Invention

This invention relates to forming terminal structures extending from a side of an electronic module for an attachment by a surface mounting process, and more particularly, to a method for preparing "L"-shaped terminal sections supplied as part of a thin metallic sheet and for inserting such sections into an electronic module.

2. Background Information

The density of electrical circuits on a printed circuit board is constantly being increased in an effort to increase the capabilities of electronic equipment without an equivalent increase in the size of such equipment. One process which has been especially helpful in allowing an increase in circuit density is the surface mounting of components having terminals soldered to pads on the surface of the circuit board instead of pins soldered within holes extending through the circuit board. One limitation of the surface mounting process is that satisfactory bonds are not made with terminals extending between a component and the circuit board to which it is attached; the terminals must extend outward from the component along its edges.

In some instances, the number of external circuit attachments which must be made to a component exceeds the number of terminals which can be fastened in a single row along the edges of the component. Then it is necessary to provide two or more rows of terminals along these edges, while providing a manner for handling different shapes of terminals.

The installation of terminal structures in an electronic component is typically accomplished by installing a number of finished individual terminals in the component. The processes of producing such terminals include metal stamping, forming, and plating operations. While such a method works well in many applications, it is dependent on the shape of the terminals and on the characteristics of the component into which the terminals are to be inserted.

What is needed is a method for the simultaneous installation of a number of surface-mount terminals in an overall structure allowing the attachment of such terminals in several rows along an edge of an electronic circuit device.

3. Description of the Prior Art

U.S. Pat. Nos. 3,550,250, 4,398,628, 4,176,448, 4,543,714 and 4,598,471 describe various forms of apparatus providing for the insertion of terminal structures into electrical or electronic devices. The terminal structures are supplied to the apparatus in the form of a strip, which includes a number of preformed terminal structures. Within the apparatus, forming operations do not occur; at most, the terminal structures are prepared for insertion by severing them from a web extending along a single side, or along each side, of the strip. This type of preparation is adequate for the applications described in these patents because each terminal structure is elongated in a direction transverse to the web, without a significant elongation or extension perpendicular to this direction.

What is needed is a method allowing the preparation and insertion of "L"-shaped terminal structures formed as integral portions of a strip. This shape is needed because it allows the use of multiple rows of such terminal structures, with each row extending outward from a side of an electronic component and downward through differing distances, presenting a multi-row array of terminal locations for soldering with a surface-mount process. Such a process should further permit the processing of terminal structures placed close together along the strip, despite the fact that such structures extend significantly in mutually perpendicular directions.

U.S. Pat. No. 4,807,357 describes a method for bending and inserting a pin in one sequential operation. The method includes the steps of feeding an end of a pre-notched pin wire, shearing a connector terminal from the end of the wire, clamping one part of the terminal between jaws, displacing the jaws toward a hole in a printed circuit board, displacing a bending shoe at a rate faster than the rate at which the jaws are displaced whereby the bending shoe bends the connector terminal pin while the jaws are moving, and inserting the bent terminal into a hole in a printed circuit board.

While this method succeeds in forming "L"-shaped terminals, it is limited in speed by the fact that these terminals are formed on a one-to-one basis. Furthermore, each terminal is itself formed into an "L" shape during the process, which is described as being applied to the construction of a relatively large pin header on a printed circuit board. To obtain the dimensional accuracy needed in electronic component terminals being prepared for surface mounting, it is often more desirable to employ features generated within the individual terminals by a stamping process applied to flat material. Thus, what is again needed is a method for processing "L"-shaped terminal sections provided as portions of a flat strip, with the process preferably being capable of handling a relatively large number of terminal sections simultaneously.

SUMMARY OF THE INVENTION

In accordance with one aspect of the invention, there is provided a method for processing a number of "L"-shaped sections to form terminals extending from a side of an electronic package, in which the method includes three steps.

In the first step, a flat strip is fed in a feed direction into a first forming station. The flat strip includes a first number of "L"-shaped sections, each of which is attached at a first end by a connecting portion to a first web extending in a longitudinal direction parallel to the feed direction as a part of the strip. Each "L"-shaped section includes a first leg extending at a first oblique angle relative to the longitudinal direction from the first end to and intersection point, and a second leg extending at a second oblique angle relative to the longitudinal direction from the intersection point to a second end of the "L"-shaped section. The "L"-shaped sections extend in a spaced-apart relationship, being arrayed in the longitudinal direction.

In the second step, each "L"-shaped section within a second number of such sections is supported within the first forming station from a first side of the strip, near the first and second ends of the "L"-shaped section, with outer forming surfaces extending from a first die block. Each "L"-shaped section, while being supported in this way, is pushed along its first and second legs, from a second side (opposite the first side of the strip) with a central forming surface extending from a second die block, twisting the connecting portion attaching the "L"-shaped section to the first web, so that the "L"-shaped section extends in an individual plane essentially perpendicular to the first web.

In the third step, each "L"-shaped section within the second number of such sections is pushed from the second side of the strip with a flexural forming surface, deflecting the connecting portion attaching the "L"-shaped section until the second leg extends within the individual plane in a direction essentially parallel to the first web.

BRIEF DESCRIPTION OF THE DRAWINGS

FIGS. 3A and 3B, is a plan view of apparatus for forming the "L"-shaped terminal elements of FIG. 1 within the punch press of FIG. 2;

DETAILED DESCRIPTION

Figure 1:
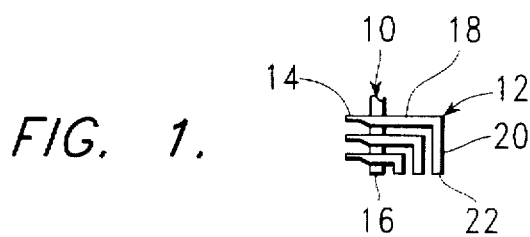
FIG. 1 is a transverse cross-sectional view of a circuit module including "L"-shaped terminal elements constructed using the process of the present invention.

FIG. 1 is a transverse cross-sectional view of a circuit module, generally indicated as 10, including a number of "L"-shaped conductive terminals 12, arranged, for example, in three rows. Each terminal 12 includes a tip portion 14 extending into the module through a slot in an insulating terminal carrier 16. Each terminal 12 also includes an outward extending portion 18 and a descending portion 20. Between each of the three rows of contact terminals, the lengths of the outward extending portions 18 and of the descending portions 20 are varied to provide uniformly separated descending portions 20 extending downward to present flat tip surfaces 22 at a common level. The individual terminals 12 of the three rows may be aligned in vertical planes, or the terminals 12 in each of the rows may be staggered, or offset, so that no two terminals 12 from different rows are in the same vertical plane.

This arrangement thus provides a number of tip surfaces 22, each of which can be subsequently connected to a circuit board (not shown) by means of a surface mounting solder process. The shape of the terminals 12 allows multiple rows of terminals, in this example three rows, to be electrically connected along an edge of the circuit module 10, so that additional external circuits can be attached without increasing the size of the module.

Figure 2:
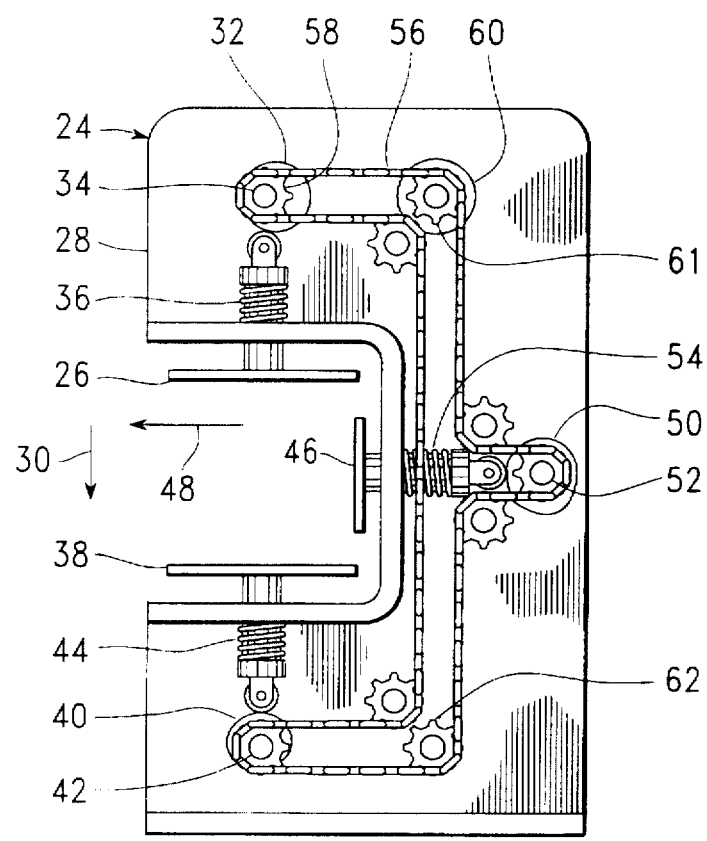
FIG. 2 is an end elevation of a punch press configured for carrying out the process of the present invention.

FIG. 2 is an end view of a punch press, generally indicated as 24, providing an example of a machine tool which can be used to operate specific tooling for forming a row of the "L"-shaped terminals 12 shown in FIG. 1. The punch press 24 includes an upper moving platen 26, which is mounted within a frame 28 to slide vertically, being driven in the direction of arrow 30 by an upper cam 32 turning with an upper camshaft 34, and being returned opposite the direction of arrow 30 by a compression spring 36. Similarly, a lower moving platen 38 is mounted within the frame 28 to slide vertically, being driven opposite to the direction of arrow 30 by a lower cam 40 turning with a lower camshaft 42, and being returned by a compression spring 44. A sliding platen 46 is also mounted within the frame 28 to slide horizontally, being driven in the direction of arrow 48 by a slide cam 50 turning with a slide camshaft 52 and returned by a compression spring 54.

The rotation of camshafts 34, 42, 52 is synchronized by a chain 56 engaging a sprocket 58 on each camshaft, with the chain 56 being driven by a drive motor 60 turning a drive sprocket 61. Idler sprockets 62 may be adjusted to maintain chain tension, and the drive motor 60 may include gearing to provide a suitable drive speed. For the particular operations needed to produce a row of the "L"-shaped terminals 12 (shown in FIG. 1), and to install this row of terminals into the circuit module 10 (also shown in FIG. 1), the cams 32, 40 are arranged so that the platens 26, 38 are moved closer to one another during a first portion of a processing cycle, to be moved apart during a second portion of the processing cycle. The cam 50 is arranged so that the sliding platen 46 is moved in the direction of arrow 48 and returned opposite this direction during the second portion of the processing cycle.

Figure 3:
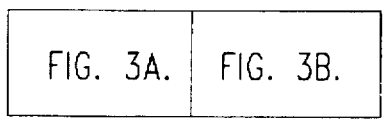
FIG. 3, which comprises
Figure 3B:
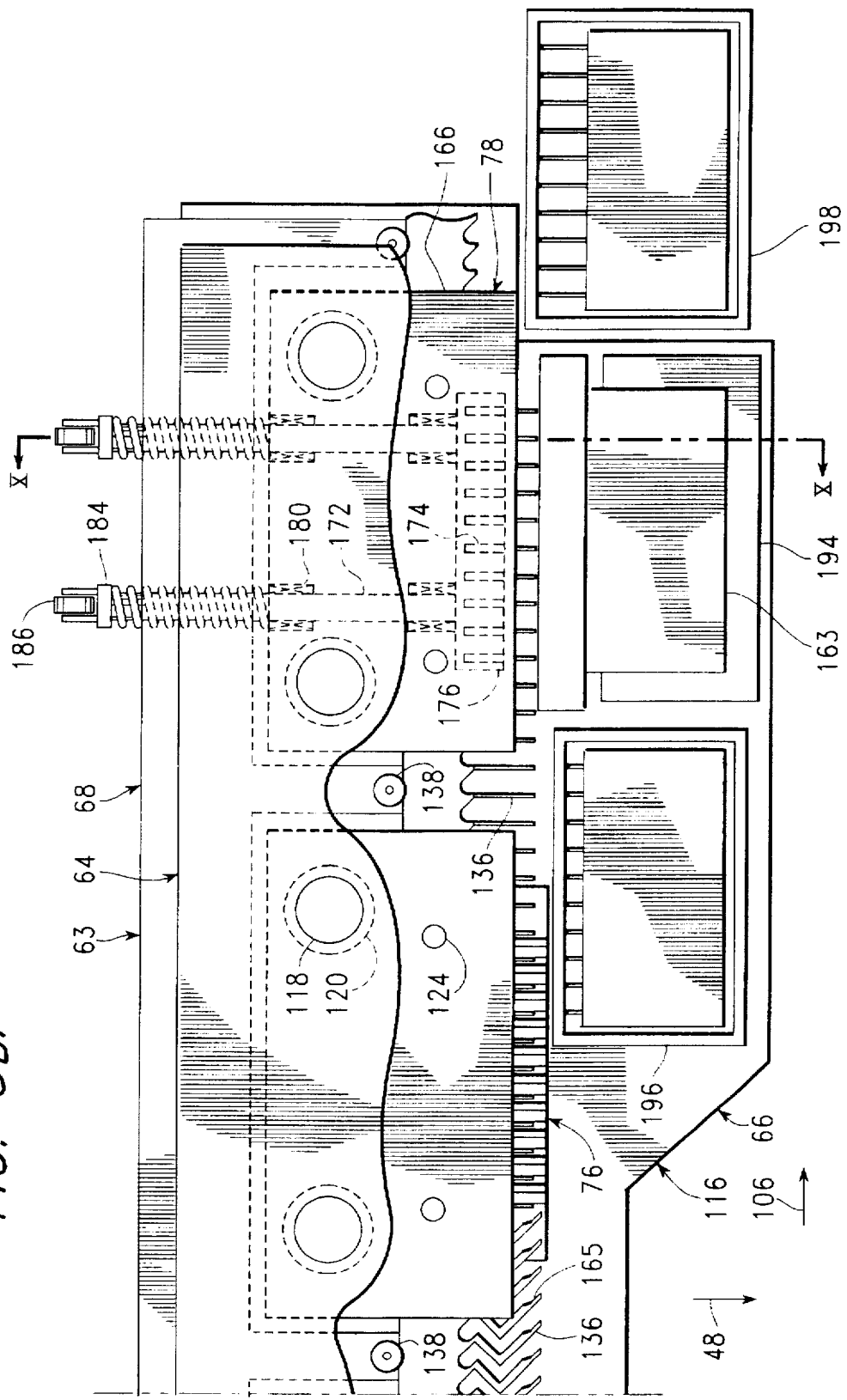

FIG. 3, which comprises FIG. 3A and 3B, is a plan view of apparatus, generally indicated as 63, for forming a row of the "L"-shaped terminals 12 shown in FIG. 1 within the punch press 24 of FIG. 2.

Referring to FIGS. 2 and 3, this apparatus 63 includes an upper die portion, generally indicated as 64, moving with upper platen 26, a lower die portion, generally indicated as 66, moving with lower platen 38, and a stationary central support plate, generally indicated as 68, connected to the frame 28 of punch press 24. Within this apparatus 63, various processes are applied to a flat strip 70 fed from a reel (not shown) through a strip feeding station, generally indicated as 72, a notching station, generally indicated as 74, a forming station, generally indicated as 76, and an insertion station, generally indicated as 78.

Referring to FIG. 3A, before the strip 70 is supplied to this apparatus 63, it is prepared by various conventional stamping and plating processes to include a number of "L"-shaped sections 80, each of which is similar to a terminal element 12 (shown in FIG. 1), except for connection to a front web portion 82 and a rear web portion 84 of the strip 70. The individual "L"-shaped sections 80 are obliquely angled relative to a rear external edge 86 of the strip 70, extending longitudinally along the strip 70, and are placed close to one another in a pattern which periodically repeats along a longitudinal axis parallel to this edge 86.

The strip 70 is pulled from the reel (not shown), in which it is supplied, into the feeding station 72, where the strip moves under an idler roll 88, through a stationary clamping block 90 and a reciprocating clamping block 92. The idler roll 88 is mounted to rotate on a shaft 94, which is in turn mounted above the central plate 68 on a pair of mounting blocks 96. The reciprocating clamping block 92 is mounted to slide on a pair of shafts 98 extending within an aperture 100 in the central plate 68. The reciprocating clamping block 92 is driven in either direction between the position in which it is shown and a position indicated by dashed lines 102 by means of a pneumatic actuator 104. Each of the clamping blocks 90, 92 includes upper and lower sections (not individually shown) which are actuated to clamp or release the portion of the strip 70 passing therethrough. Thus, the incremental movement of strip 70 in the feed direction indicated by arrow 106 is achieved by releasing this strip from the stationary clamping block 90 as the reciprocating clamping block 92 engages the strip 70. The pneumatic actuator 104 then moves reciprocating clamping block 92 from the position indicated by dashed lines 102 to the position in which it is shown, pulling along the strip 70. Next, the stationary clamping block 90 engages strip 70, holding it in the position to which it has been advanced, as pneumatic actuator 104 returns the reciprocating clamping block 92 to the position indicated by dashed lines 102.

Also within feeding station 72, the portion of strip 70 beyond the area through which reciprocating clamping block 92 moves is aligned and supported between a pair of rollers 108 rotatably mounted on the central plate 68.

Figure 4:
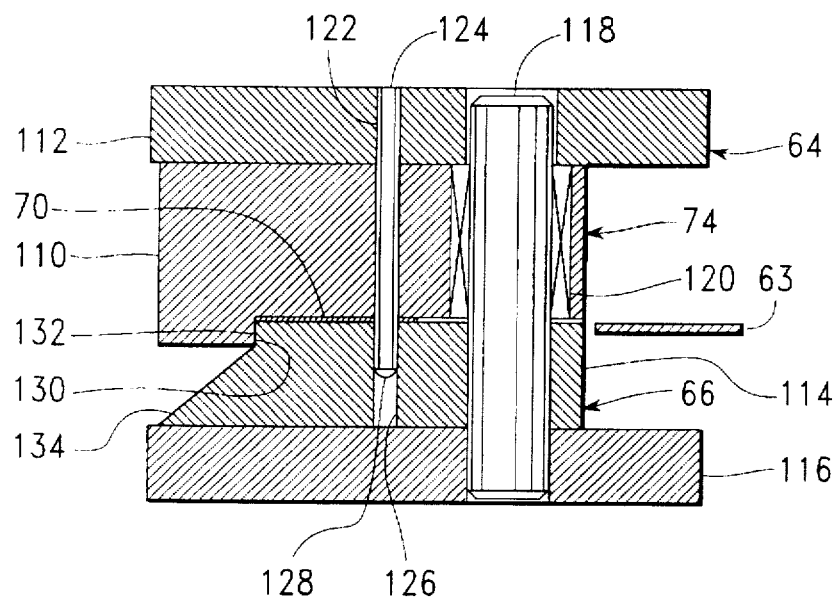
FIG. 4 is a transverse cross-sectional elevation of the apparatus of FIG. 3A, taken as indicated by section lines IV—IV therein to show the configuration of a notching station.

FIG. 4 is a transverse cross-sectional elevation of the apparatus 63, taken as indicated by section lines IV—IV in FIG. 3A to show the configuration of the notching station 74.

Referring to FIGS. 3 and 4, the various die blocks of upper die portion 64, such as notching station upper die block 110, are attached to an upper die plate 112, which moves with upper platen 26 (shown in FIG. 2). Similarly, the various die blocks of lower die portion 66, such as notching station lower die block 114, are attached to a lower die plate 116, which moves with lower platen 38 (also shown in FIG. 2). The die portions 64, 66 are mounted to slide toward and away from one another by means of a number of guide posts 118 extending upward from the lower die portion 66 into bushings 120 within the upper die portion 64. These bushings 120 may be sliding bushings, or they may be anti-friction bushings of various types employing balls or rollers to provide for the desired movements in an absence of sliding friction.

The strip 70 also includes a number of indexing holes 122 which are used to determine the precise location of this strip within each station, such as notching station 74, as the die portions 64, 66 are closed together. Adjacent indexing holes 122 are separated by a center-to-center distance including the number of "L"-shaped sections 80 to be moved simultaneously through the various processes occurring within the die portions 64, 66. In the example of FIG. 3, ten "L"-shaped sections 80 are simultaneously processed each time the die portions 64, 66 are closed and opened. The center-to-center distance between adjacent holes 122 is also equal to the distance through which the strip 70 is moved with each movement of reciprocating clamping block 92. The upper die portion 64 also includes a number of a number of alignment pins 124, which extend through various of the indexing holes 122 into mating alignment holes 126 within the lower die portion 68. Each alignment pin 124 extends downward from an upper die block, such as upper notching station die block 110, having a rounded or tapered tip 128 which precisely aligns the strip 70 as it passes through an alignment hole 126.

The notching station upper die block 110 includes cutting surfaces 130, which extend downward into a mating cavity 132 of notching station lower die block 114 when these die blocks 110, 134 are moved together, performing the notching function by removing a section of lower web 82. The cut-off, scrap sections of lower web 82 fall away along an inclined surface 134 of lower die block 114. Thus, the strip 70 leaves notching station 74 including a number of "L"-shaped sections 136 fastened only to rear web 84. Central plate structure 68 also includes provisions for supporting the strip 70 as it leaves notching station 74, of which an additional roller 138 is exemplary.

Figure 5:
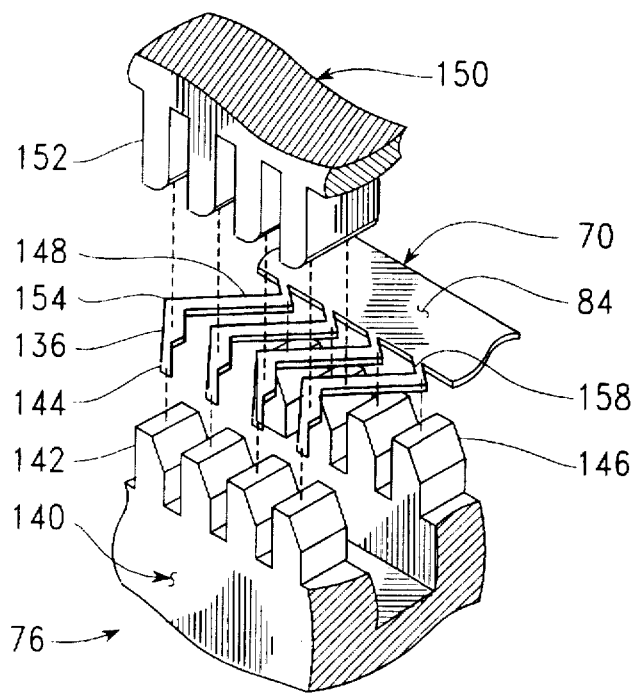
FIG. 5 is a fragmentary exploded isometric view of forming surfaces within a forming station of the apparatus of FIG. 3, and of a metal strip to be formed, extending therebetween.

FIG. 5 is a fragmentary exploded isometric view of forming surfaces within forming station 76 and of the strip 70 extending therebetween. Lower forming die block 140 includes a number of front forming block sections 142, which extend upward to contact front rightward-extending portions 144 of "L"-shaped sections 136 extending thereabove. Lower forming die block 140 also includes a number of rear forming block sections 146, which extend upward to contact rear rightward-extending portions 148 of the "L"-shaped sections 136. Upper forming die block 150 includes a number of central forming block sections 152 which extend downward to contact a central portion 154 of each "L"-shaped section 136, which extends leftward from the rightward-extending portions 144, 148 thereof.

Figure 6:
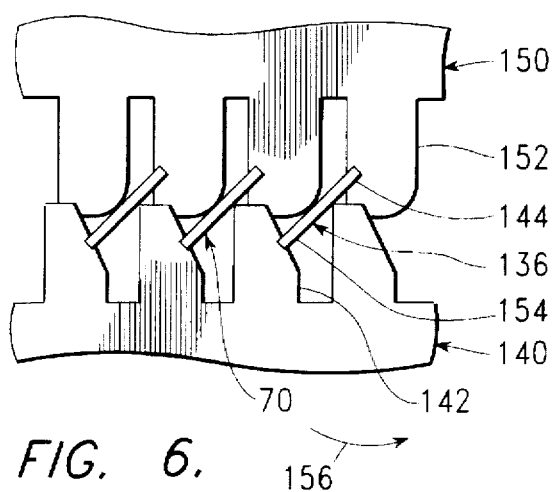
FIG. 6 is a fragmentary front elevation of die blocks within the forming station of the apparatus of FIG. 3, in a first partially closed position.

FIG. 6 is a fragmentary front elevation of the forming die blocks 140, 150 in a partially closed position, with the strip 70 partially formed.

Referring to FIGS. 5 and 6, the upward movement of lower forming die block 140 brings lower die forming block sections 142, 146 into position to support rightward extending portions 144, 148 from below, so that the downward movement of central forming block sections 152, rotates each "L"-shaped section 136 in the direction of arrow 156.

Figure 7:
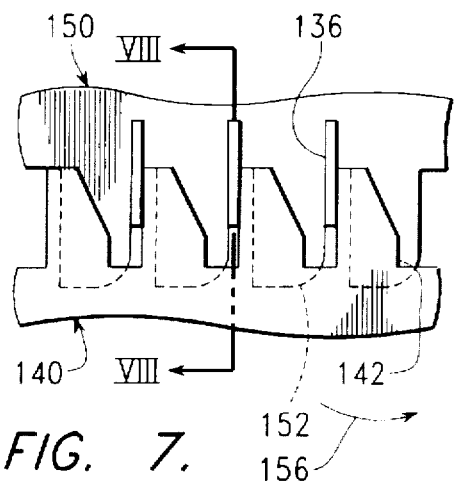
FIG. 7 is a fragmentary front elevation of the die blocks of FIG. 6 in a second partially closed position, which is more nearly closed than the first position of FIG. 6.

FIG. 7 is a fragmentary front elevation of the forming die blocks 140, 150 in a second partially closed position, which is closed beyond the position of FIG. 6.

Referring to FIGS. 5 and 7, at the level of closure of FIG. 7, the continued movement of forming block sections 142, 146, 152 has moved each "L"-shaped section 136 farther in the direction of arrow 156, into an essentially vertical orientation, with all of the deformation of strip 70 occurring in the sections 158 connecting "L"-shaped sections 136 with rear web 84.

Figure 8:
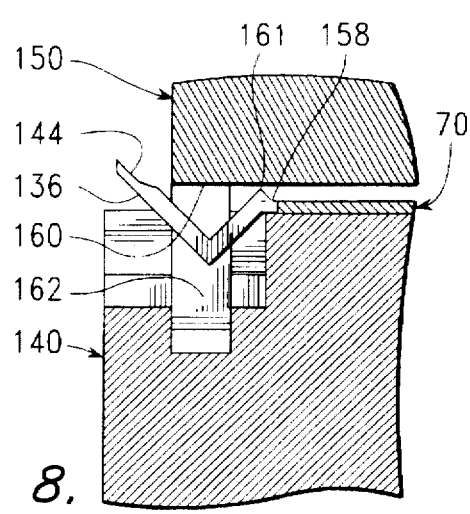
FIG. 8 is a fragmentary transverse cross-sectional elevation of the die blocks of FIG. 7 in the second partially closed position of FIG. 7, taken as indicated by section lines VIII—VIII in FIG. 7.

FIG. 8 is a fragmentary transverse cross section of the forming die blocks 140, 150 in the partially closed position of FIG. 7, taken as indicated by section lines VIII—VIII in FIG. 7. The previously leftward-extending portion 154 of each "L"-shaped section 136 now extends upward, with only a rotation, or twist, in the direction of arrow 156 (shown in FIG. 7) having occurred in each connecting section 158.

Figure 9:
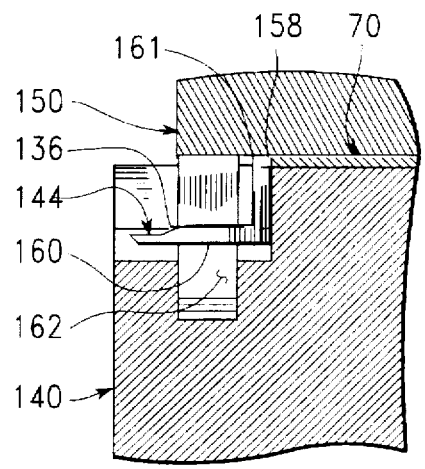
FIG. 9 is a fragmentary transverse cross-sectional elevation similar to FIG. 7, except that the die blocks are fully closed.

FIG. 9 is a partial fragmentary transverse cross section of the forming die blocks 140,150 in a fully closed position, also taken as indicated by section lines VIII—VIII in FIG. 7, showing the strip 70 in a fully-formed condition.

Referring to FIGS. 8 and 9, with the final portion of the closure of die blocks 140, 150, a lower die surface 160 of upper die block 150 contacting the upwardly-extending tip 161 of "L"-shaped section 136, forms this section 136 downward, deflecting the connecting section 158, so that end portion 144 is brought into the horizontal position subsequently needed for insertion into the electronics module 12 (shown in FIG. 1).

Figure 10:
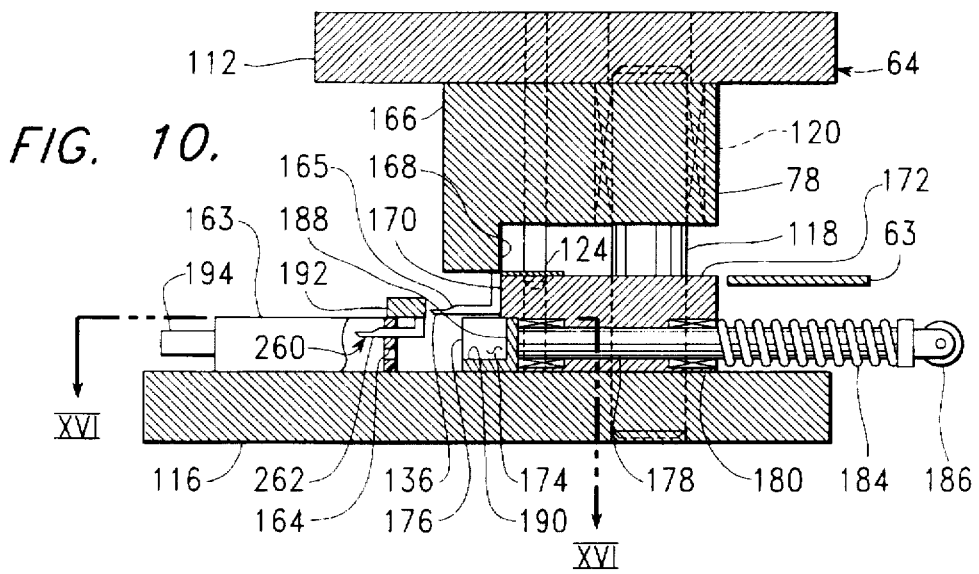
FIG. 10 is a transverse cross-sectional elevation of the apparatus of FIG. 3B, taken as indicated by section lines X—X therein to show the configuration of a station for inserting "L"-shaped terminal elements into a circuit module.

FIG. 10 is a transverse cross-sectional elevation of the apparatus 63, taken as indicated by section lines X—X in FIG. 3B to show the configuration of insertion station 78.

Referring to FIGS. 3B and 10, insertion station 78 trims the individual "L"-shaped sections 136 from rear web 84 and inserts these sections 136 into a circuit package 163 having slots 164 configured to accept tip portion 165 thereof. Upper die portion 64 includes an upper trimming die block 166 having a downward-extending trimming surface 168 which moves downward adjacent a front surface 170 of a lower trimming die block 172 within the lower die portion 66, shearing the "L"-shaped sections 136 from the strip 70. After shearing, further motion of the upper trimming die block 166 pushes each sheared section 136 downward into a slot 174 within a slotted receiving block 176. (FIG. 10 shows the insertion station 78 with the "L"-shaped sections 136 about to be sheared away and pushed to the bottom of the slot 174).

Continuing to refer to FIGS. 3B and 10, and referring additionally to FIG. 2, the slotted receiving block 176 is mounted to slide horizontally within lower trimming die block 172, by means of a pair of shafts 178 sliding within bearings 180 of the block 172. Each shaft 178 is held to the rear, opposite the direction of arrow 48, by means of a compression spring 184. A roller 186, rotatably fastened to each shaft 178, rolls on sliding platen 46, allowing the simultaneous movement of lower trimming die block 172 with lower platen 38 and of the shafts 178 with sliding platen 46.

After the closure of trimming die blocks 166,172, as these die blocks are being opened by the movement of upper platen 26 and lower platen 38, sliding platen 46 drives slotted receiving block 176 frontward, in the direction of arrow 48, as the tip portion 165 of each "L"-shaped section 136 within the receiving block 176 is driven into the circuit package 163 through a slot 164 therein. When the sections 136 have been fully inserted into the circuit package 163, a return movement of sliding platen 46, opposite the direction of arrow 48, allows a return movement of the receiving block 176, with force supplied by the compression springs 184, into the position in which it is shown. At this point, the receiving block 176 is ready to receive another group of "L"-shaped segments 136.

During this insertion process, the force needed to drive each tip portion 165 through a slot 164 is supplied by a rear slot wall 188 pushing the "L"-shaped section 136. Proper vertical alignment is retained as the section 136 is held between a bottom slot wall 190 and a stationary alignment plate 192.

The circuit package 163 is driven into place to receive "L"-shaped sections 136 from the receiving block 176 by means of an indexing mechanism 194, which picks circuit packages 163, one at a time, from the bottom of a hopper 196, through which they are supplied. This indexing mechanism 194, which is moved by electrical or pneumatic means well known to those skilled in the art, drives individual circuit packages 163 in a sequential manner in the direction of arrow 106, being preferably mounted to lower die plate 116 so that the circuit packages 163 are properly aligned with respect to the receiving block 176 regardless of the vertical position of the block 176. After completing the process of inserting "L"-shaped sections 136, the circuit package 163 is moved to a bin 198, into which it is dropped as a part having completed this process.

Referring to FIG. 3, the exemplary process described above places ten "L"-shaped sections 136 along a side of each circuit package 163. This process can be readily modified to increase or decrease the number of "L"-shaped sections 136 simultaneously processed and inserted by changing the length of the various die blocks, the number of forming block sections 142, 146, 152 (shown in FIG. 5) in forming station 76, and the number of slots 174 in receiving block 176.

Figure 11:
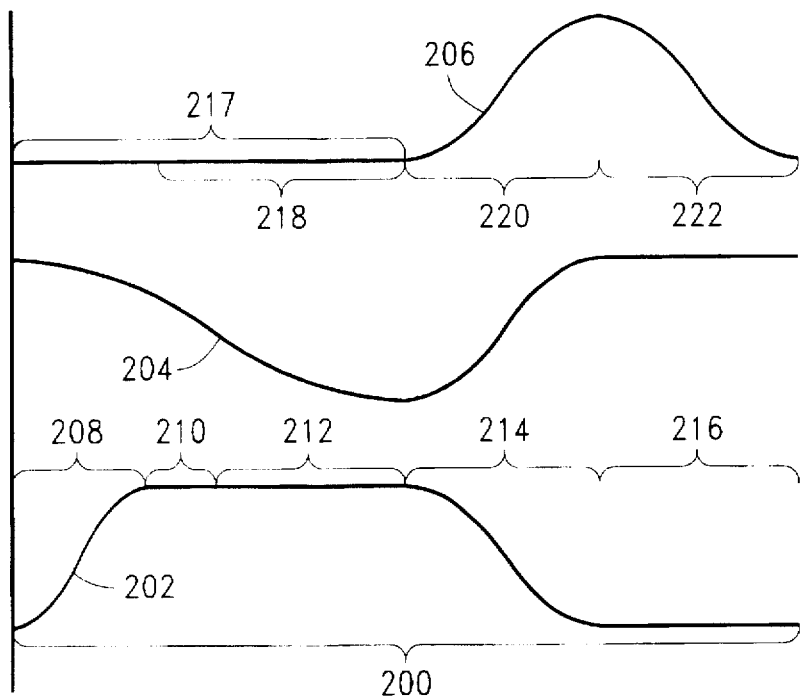
FIG. 11 is a graphical view of the movement of platens within the punch press of FIG. 2 to support operation of the apparatus of FIG. 3.

FIG. 11 is a graphical view of the motions of lower platen 38, upper platen 26, and sliding platen 46 of the press 24 (shown in FIG. 2), indicating how these motions occur during a single cycle 200 of the press 24, as the associated cams 40, 32, and 50 each complete a single revolution, being constrained to turn together by engagement with drive chain 56. In FIG. 11, a lower curve 202 shows the motion of lower platen 38, an intermediate curve 204 shows the motion of upper platen 26, and an upper curve 206 shows the motion of sliding platen 46.

Referring to FIGS. 2, 3, and 11, during a first portion 208 of the machine cycle 200, the lower platen 38 moves upward, as indicated by curve 202, so that lower forming block surfaces 142,146 (shown in FIG. 5) are brought into place to support portions of the strip 70 from below. With this support, the upper platen 26 is moved downward, as indicated by curve 204, during a next portion 210 of the cycle 200, twisting "L"-shaped sections 136 as described in reference to FIGS. 6 and 7. This downward motion of upper platen 26 continues through a portion 212 of the cycle 200, in which "L"-shaped sections 136 are formed downward as described above in reference to FIGS. 8 and 9.

During a subsequent portion 214 of cycle 200, both lower platen 38 and upper platen 26 are moved apart from one another, causing a separating both lower die portion 66 and upper die portion 64 from the strip 70 to an extend permitting the movement of this strip, with "L"-shaped sections 136 thereof formed as shown in FIG. 9, past ascending and descending structures of the die portions 64, 66, such as forming block surfaces 142, 146, 152 (shown in FIG. 5). Thus, in the remaining portion 216 of the machine cycle 200, the strip 70 is fed in the direction of arrow 106 by means of feeding station 76.

During a portion 217 of the cycle 200, the previously-processed circuit structure 163 is moved into the bin 198, and a new circuit structure 163 is brought, by means of indexing mechanism 194, into place for the insertion of "L"-shaped terminal sections 136.

During a portion 218 of the cycle 200, "L"-shaped sections 136 are trimmed from the strip 70 and are driven into slots 174 of the receiving block 176, as described above in reference to FIG. 10. Next, during portion 220 of cycle 200, tip portions 165 of "L"-shaped sections 136 are inserted into slots 164 of an electronic module 163, as receiving block 176 is driven in the direction of arrow 48 by sliding platen 46, as shown by curve 206 and again as described in reference to FIG. 10. Then, during the remaining portion 222 of cycle 200, the receiving block 176 is returned opposite the direction of arrow 48 to become ready for the next machine cycle.

Figure 12:
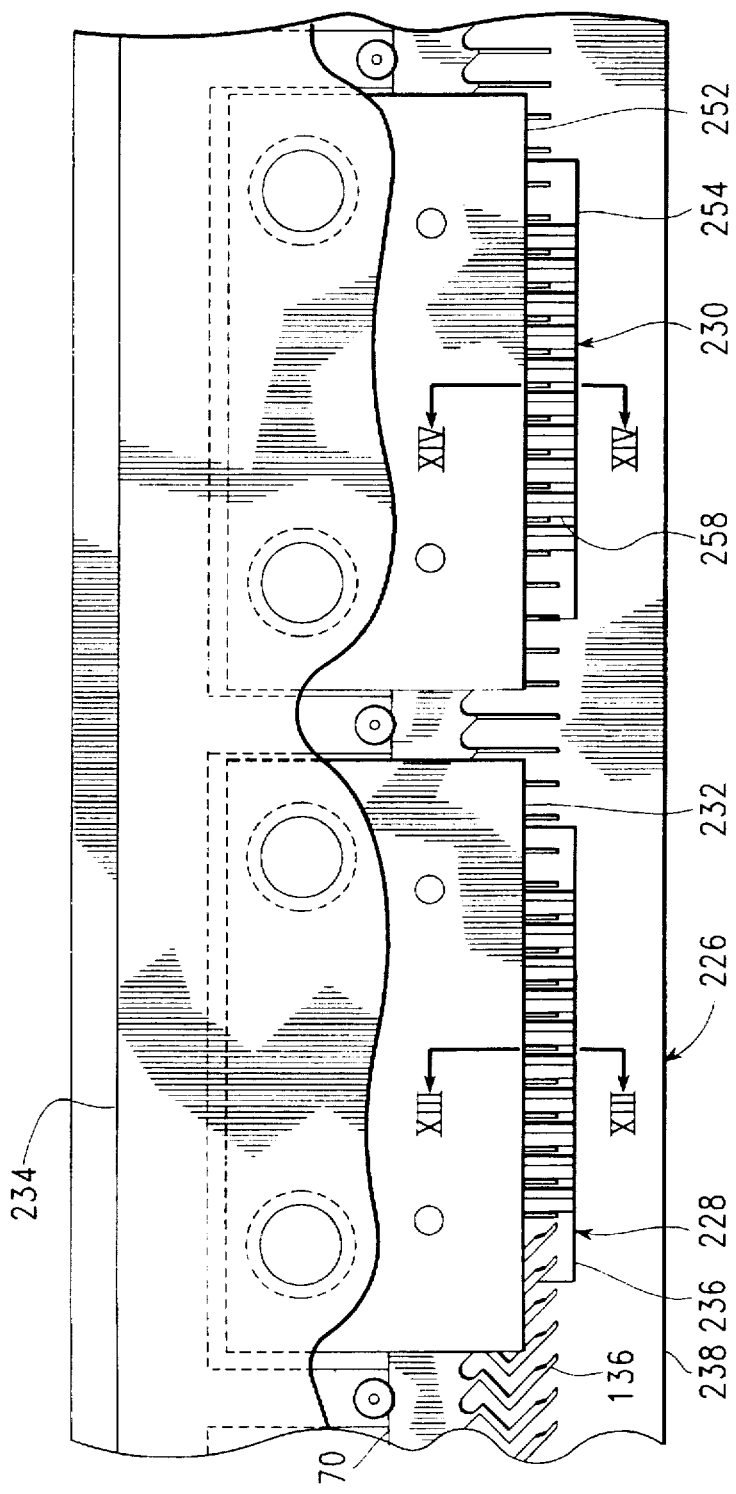
FIG. 12 is plan view of alternative apparatus for forming the "L"-shaped terminal elements of FIG. 1 within the punch press of FIG. 2.

FIG. 12 is a fragmentary plan view of alternative apparatus, generally indicated as 226, for forming the "L"-shaped sections 136 of strip 70 into the orientation needed for insertion into the circuit package 163 (shown in FIG. 10). This alternative apparatus 226 includes a first forming station, generally indicated as 228, and a second forming station, generally indicated as 230.

Figure 13:
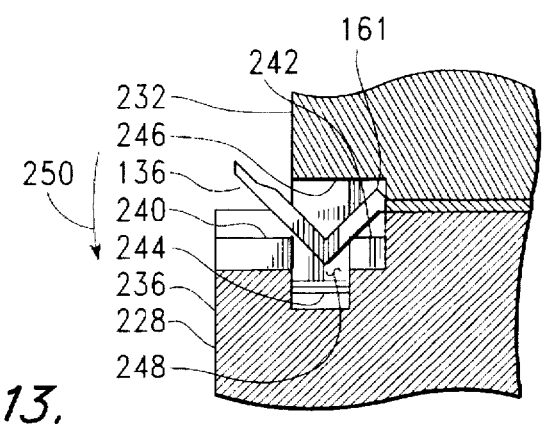
FIG. 13 is a fragmentary transverse cross-sectional elevation of the apparatus of FIG. 12, taken as indicated by section lines XIII—XIII therein through a first forming station.

FIG. 13 is a fragmentary transverse cross-sectional view of the alternative apparatus 226, taken as indicated by section lines XIII—XIII in FIG. 12.

Referring to FIGS. 12 and 13, first forming station 228 includes an upper die block 232 fastened to an upper die plate 234, which moves with upper platen 26 (shown in FIG. 2), and a lower die block 236 fastened to a lower die plate 238, which moves with lower platen 38 (also shown in FIG. 2). Lower die block 236 includes front forming block sections 240 and rear forming block sections 242. Upper die block 232 includes central forming block sections 244. These forming block sections 240, 242, 244 cooperate, as previously described in reference to forming block sections 142, 146, 152 of FIGS. 5–8, rotating each "L"-shaped section 136 of strip 70 into the position shown in FIG. 13. The surface 246 at the end of each slot 248 extending upward between adjacent central forming block sections 244 is high enough to allow the closure of the die blocks 232, 236 without bending the rotated section 136 downward, the direction of arrow 250.

Figure 14:
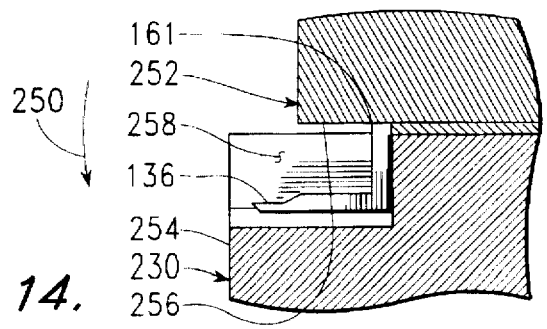
FIG. 14 is a fragmentary transverse cross-sectional elevation of the apparatus of FIG. 12, taken as indicated by section lines XIV—XIV therein through a second forming station.

Referring to FIGS. 12 and 14, second forming section 230 includes an upper die block 252 fastened to upper die plate 234 and a lower die block 254 fastened to lower die plate 218. As these die blocks 252, 254 are closed, a lower surface 256 of upper die block 252 contacts the upward extending tips 161 of "L"-shaped sections 136, rotating these sections 136 downward, in the direction of arrow 250, into slots 258 extending upward within lower die block 254. This operation prepares the sections 136 for insertion into a circuit package 163, using the apparatus and method described above in reference to FIG. 10.

Thus, in the alternative apparatus 226, first forming station 228 and second forming station 230 together replace the forming station 76 of apparatus 63. The platen movements needed to drive the alternative apparatus 226 are generally as described above in reference to FIG. 11, except that less motion of upper platen 26 (shown in FIG. 2) is required, since the same portion of such motion is used for both the twisting and downward forming processes applied by the alternative apparatus 226 to the "L"-shaped sections 136. Other aspects of the alternative apparatus 226 are generally as described above in reference to FIGS. 2–11.

The processes described above, using either apparatus 63 of FIG. 3 or the alternative apparatus 226 of FIG. 12, is conveniently applied in several methods to obtain additional terminal sections extending from a single side of a circuit package. These methods may be used, separately or in combination, to obtain an array of two or more rows of terminals to allow an increase in circuit density with the surface mounting process, to increase the density of terminals ultimately forming a single row by inserting terminal elements in an interstitial manner, or to increase the length of a single row by combining therein two or more adjacently disposed rows of terminals.

In FIG. 10, the insertion process is shown as being applied to a circuit structure 163 in which a row of "L"-shaped sections 260 has previously been installed by a similar process. Each of the leg portions 262, 264 of each "L"-shaped section 260 are shorter than the corresponding leg portions of the "L"-shaped sections 136 presently being inserted, allowing the previously-inserted "L"-shaped sections 260 to fit within and above the portions of "L"-shaped sections 136 extending outward from the circuit structure 163 after insertion (with the circuit structure 163 in the inverted orientation shown).

Figure 15:
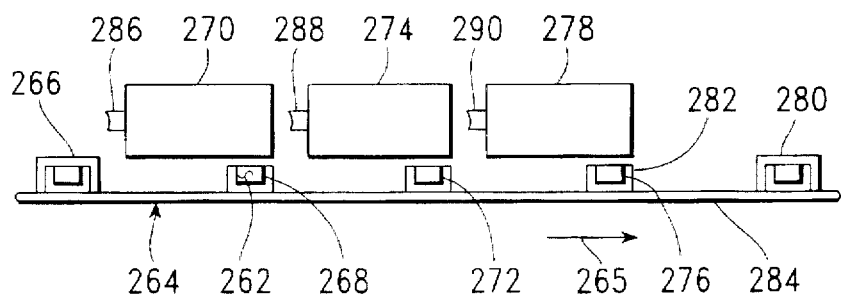
FIG. 15 is a schematic view of a system using the apparatus of FIG. 3, or the alternative apparatus of FIG. 12, in three locations to place three rows of "L"-shaped terminal elements in a circuit module.

FIG. 15 is a schematic view of an exemplary process for inserting three rows of "L"-shaped terminal sections to extend from a side of a circuit structure 262, with the three rows of contacts being related, one to another, as the two rows of contacts 136, 260 of FIG. 10. An indexing mechanism 264 moves the circuit structures 262, in the direction of arrow 265, from a supply hopper 266 to a first insertion station 268, in which "L"-shaped terminal sections from first terminal processing apparatus 270 are inserted. Each circuit structure 262 is next moved to a second insertion station 272, in which "L"-shaped terminal sections from second terminal processing apparatus 274 are inserted. Each circuit structure 262 is then moved to a third insertion station 276, in which "L"-shaped terminal sections from third terminal processing apparatus 278 are inserted. Finally, each circuit structure 262 is moved to a receiving tube 280, into which parts having completed this process are dropped. To provide these movements, indexing mechanism 264 includes a number of holders 282, which are pulled by a belt 284 among the various stopping places 266, 268, 272, 276, which are separated by equal distances. The belt 284 may be formed as a loop, so that the holders 282 are recirculated during the process. Guide rails and detent mechanisms (both not shown) are used to precisely locate each holder 282 at each stopping place.

First terminal processing apparatus 270 processes "L"-shaped sections from a first strip 286, while second terminal processing apparatus 274 processes "L"-shaped sections from a second strip 288, and while third terminal processing apparatus 278 processes "L"-shaped section from a third strip 290. To provide the nesting properties shown in FIGS. 1 and 10, both legs of each "L"-shaped section within strip 286 are shorter than the corresponding legs of each such section within strip 288, which are in turn shorter than the corresponding legs of each such section within strip 290.

Each terminal processing apparatus 270, 274, 278 makes use of the various processes described above for either apparatus 63 (shown in FIG. 3) or alternative apparatus 226 (shown in FIG. 12). However, various features of the apparatus 270, 274, 278 are dimensionally different as required to engage "L"-shaped terminal sections having legs of different lengths.

Figure 16:
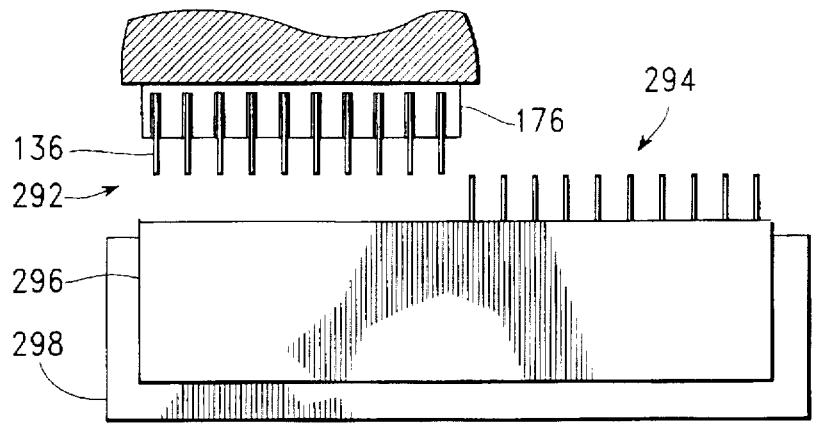
FIG. 16 is a fragmentary plan view of the apparatus of FIG. 10 inserting a second row of "L"-shaped terminal elements in a circuit module adjacent a previously-inserted first row thereof, taken as indicated by section lines XVI—XVI in FIG. 10.
Figure 17:
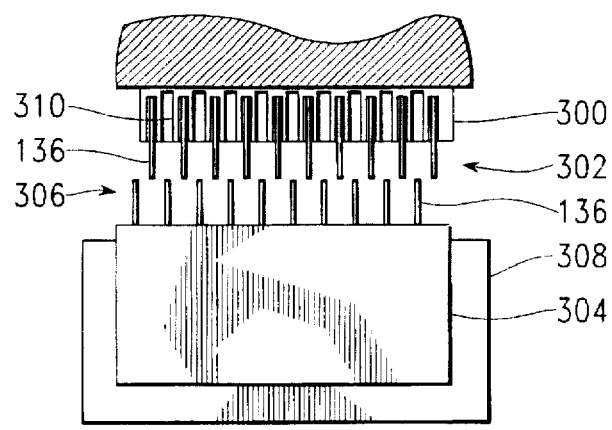
FIG. 17 is a fragmentary plan view similar to FIG. 16, except that the apparatus is inserting a second row of "L"-shaped terminal elements in a circuit module, individually within a previously-inserted first row thereof.

FIGS. 16 and 17 are fragmentary horizontal cross-sections of the insertion station 78, taken as indicated by section lines XVI—XVI in FIG. 10.

In the example of FIG. 16, slotted receiving block 176 is used to insert a second row 292 of "L"-shaped sections 136 after the first row 294 of such sections has been inserted into an elongated circuit structure 296. Between these insertion operations, the circuit structure 296 is moved into place to accept the additional terminal sections of row 292, by means of an indexing holder 298.

In the example of FIG. 17, a modified receiving block 300 is used to insert a second row 302 of "L"-shaped sections 136 into interstitial locations within a circuit structure 304. After a first row 306 of such sections 136 is inserted, an indexing mechanism 308 moves the circuit structure 304 into a position in which additional "L"-shaped sections 136 in row 302 are inserted between the previously-inserted sections 136 of row 306. The modified receiving block 310 includes a number of slots 310 between the slots holding "L"-shaped sections 136, providing clearance for the "L"-shaped sections 136 which have previously been installed in the circuit structure 304.

While the invention has been described in its preferred form or embodiment with some degree of particularity, it is understood that this description has been given only by way of example and that numerous changes in the details of construction, fabrication and use, including the combination and arrangement of parts, may be made without departing from the spirit and scope of the invention.

What is claimed is:

1. A method for processing a plurality of "L"-shaped sections to form terminals extending from a side of an electronic package, wherein said method comprises the steps of:

(a) feeding a flat strip in a feed direction into a first forming station, wherein said flat strip includes a first plurality of said "L"-shaped sections, wherein each "L"-shaped section within said first plurality thereof is attached at a first end by a connecting portion to a first web extending in a longitudinal direction parallel to said feed direction as a portion of said strip, wherein each said "L"-shaped section includes a first leg extending at a first oblique angle relative to said longitudinal direction from said first end to an intersection point and a second leg extending at a second oblique angle relative to said longitudinal direction from said intersection point to a second end of said "L"-shaped section, wherein said "L"-shaped sections extend in a spaced-apart relationship, being arrayed in said longitudinal direction;

(b) supporting each said "L"-shaped section within a second plurality thereof within said first forming station from a first side of said strip, near said first and second ends of said "L"-shaped section, with outer forming surfaces extending from a first die block, and pushing each said "L"-shaped section within said second plurality thereof, along said first and second legs thereof, from a second side, opposite said first side of said strip, with a central forming surface extending from a second die block, twisting said connecting portion attaching each said "L"-shaped section within said second plurality thereof to said first web so that said "L"-shaped section attached thereby extends in an individual plane essentially perpendicular to said first web; and (c) pushing each said "L"-shaped section within said second plurality thereof from said second side of said strip with a flexural forming surface, deflecting said connecting portion attaching each said "L"-shaped section within said second plurality thereof until said second leg extends within said individual plane in a direction essentially parallel to said first web.

2. The method of claim 1:

wherein said flexural forming surface forms a part of said second die block;

wherein said step (b) is performed during a first portion of a closing movement of said first and second die blocks; and wherein said step (c) is performed during a second portion of a closing movement of said first and second die blocks.

3. The method of claim 1:

wherein said flexural forming surface forms a part of a third die block within a second forming station, which is displaced from said first forming station in said feed direction;

wherein said step (b) is performed by closing said first and second die blocks;

wherein said step (c) is performed by closing said third die block and a fourth die blocks; and wherein said method additionally comprises a step, between said step (b) and step (c) of feeding said strip in said feed direction between said first and second forming stations so that said second plurality of "L"-shaped sections are held within said second forming station.

4. The method of claim 1, additionally comprising the steps of:

(d) feeding said strip in said feed direction so that said second plurality of "L"-shaped sections is held within an insertion station;

(e) trimming each said "L"-shaped section within said second plurality thereof from said first web by severing said connection portion attached to said "L"-shaped section;

(f) inserting each said "L"-shaped section within said second plurality thereof into a slot within a receptacle block, with a tip portion of each said "L"-shaped section within said second plurality thereof extending outward from said receptacle block;

(g) forcing each said tip portion of each said "L"shaped section within said second plurality thereof into an electronic package by relative movement between said receptacle block and said electronic package.

5. The method of claim 4:

wherein said receptacle block is disposed adjacent said first side of said strip; and wherein said step (g) is performed by moving said receptacle block toward said electronic package in a direction parallel to a plane of said first web and perpendicular to said longitudinal direction.

6. The method of claim 4, additionally comprising the steps of:

(h) inserting each "L"-shaped section within a third plurality thereof into said slot within said receptacle block, with a tip portion of each said "L"-shaped section within said third plurality thereof extending outward from said receptacle block;

(i) moving said electronic package in said longitudinal direction adjacent said receptacle block; and (j) forcing each said tip portion of each said "L"shaped section within said third plurality thereof into an electronic package by relative movement between said receptacle block and said electronic package.

7. The method of claim 6, wherein said electronic package is moved in step (i) so that individual "L"-shaped sections within said third plurality thereof are inserted between individual "L"-shaped sections within said second plurality thereof.

8. The method of claim 6, wherein said electronic package is moved in step (i) so that said third plurality of "L"-shaped sections is inserted adjacent said second plurality thereof.

9. The method of claim 1, wherein said step (a) is preceded by the steps of:

feeding said strip in said feed direction so that said "L"-shaped sections within said second plurality thereof are held within a notching station; and separating a second web from said "L"-shaped sections within said second plurality thereof within said notching station, wherein said second web extends along a side of said strip opposite said first web.

10. A method for inserting first and second rows of "L"-shaped structures into an electronic package:

wherein said method includes the steps of:

(a) moving said electronic package to a first terminal processing station;

(b) inserting a tip portion of each "L"-shaped section within said first row thereof into said electronic package from a receptacle block within said first terminal processing station.

(c) moving said electronic package to a second terminal processing station; and (d) inserting a tip portion of each "L"-shaped section within said second row thereof into said electronic package from a receptacle block within said second terminal processing station; and wherein a process occurring within each said terminal processing station includes the steps of:

(e) feeding a flat strip in a feed direction into a first forming station, wherein said flat strip includes a first plurality of "L"-shaped sections, wherein each "L"-shaped section within said first plurality thereof is attached at a first end by a connecting portion to a first web extending in a longitudinal direction parallel to said feed direction as a portion of said strip, wherein each said "L"-shaped section includes a first leg extending at a first oblique angle relative to said longitudinal direction from said first end to an intersection point and a second leg extending at a second oblique angle relative to said longitudinal direction from said intersection point to a second end of said "L"-shaped section, wherein said "L"-shaped sections extend in a spaced-apart relationship, being arrayed in said longitudinal direction;

(f) supporting each said "L"-shaped section within a second plurality thereof within said first forming station from a first side of said strip, near said first and second ends of said "L"-shaped section, with outer forming surfaces extending from a first die block, and pushing each said "L"-shaped section within said second plurality thereof, along said first and second legs thereof, from a second side of said strip, opposite said first side thereof, with a central forming surface extending from a second die block, twisting said connecting portion attaching each said "L"-shaped section within said second plurality thereof to said first web so that said "L"-shaped section attached thereby extends in an individual plane essentially perpendicular to said first web;

(g) pushing each said "L"-shaped section within said second plurality thereof from said second side of said strip with a flexural forming surface, deforming in flexure said connecting portion attaching each said "L"-shaped section within said second plurality thereof until said second leg extends within said individual plane in a direction essentially parallel to said first web;

(h) feeding said strip in said feed direction so that said second plurality of "L"-shaped sections is held within an insertion station;

(i) trimming each said "L"-shaped section within said second plurality thereof from said first web by severing said connection portion attached to said "L"-shaped section; and (j) inserting each said "L"-shaped section within said second plurality thereof into a slot within a receptacle block, with a tip portion of each said "L"-shaped extending outward from said receptacle block.

11. The method of claim 10, wherein, within each said terminal processing station:

said flexural forming surface forms a part of said second die block;

said step (f) is performed during a first portion of a closing movement of said first and second die blocks; and said step (g) is performed during a second portion of a closing movement of said first and second die blocks.

12. The method of claim 10, wherein, within each said terminal processing station:

said flexural forming surface forms a part of a third die block within a second forming station, which is displaced from said first forming station in said feed direction;

said step (f) is performed by closing said first and second die blocks;

said step (c) is performed by closing said third die block and a fourth die blocks; and said method additionally comprises a step, between said step (b) and step (c) of feeding said strip in said feed direction between said first and second forming stations so that said second plurality of "L"-shaped sections are held within said second forming station.

13. The method of claim 10, wherein, within each said terminal processing station, said step (e) is preceded by the steps of:

feeding said strip in said feed direction so that said "L"-shaped sections within said second plurality thereof are held within a notching station; and separating a second web from said "L"-shaped sections within said second plurality thereof within said notching station, wherein said second web extends along a side of said strip opposite said first web.

14. Apparatus for processing a first plurality of "L"-shaped sections within a flat strip to form terminals extending from a side of an electronic package, wherein each "L"-shaped section within said first plurality thereof is attached at a first end by a connecting portion to a first web extending in a longitudinal direction parallel to said feed direction as a portion of said strip, wherein each said "L"-shaped section includes a first leg extending at a first oblique angle relative to said longitudinal direction from said first end to an intersection point and a second leg extending at a second oblique angle relative to said longitudinal direction from said intersection point to a second end of said "L"-shaped section, wherein said "L"-shaped sections extend in a spaced-apart relationship, being arrayed in said longitudinal direction, and wherein said apparatus comprises:

feed means for feeding said strip in a feed direction parallel to said longitudinal direction, with motion of said strip being intermittently stopped;

a first forming station engaging a second plurality of "L"-shaped sections within said first plurality thereof when said motion of said strip is intermittently stopped;

outer forming surfaces extending from a first die block within said first forming station, supporting each said "L"-shaped section within said second plurality thereof from a first side of said strip near said first and second ends of said "L"-shaped section;

central forming surfaces extending from a second die block within said first forming station, pushing each said "L"-shaped section within said second plurality thereof along said first and second legs thereof from a second side of said strip, opposite said first side thereof, as said "L"-shaped section is supported by said outer forming surfaces, twisting said connecting portion attaching each said "L"-shaped section within said second plurality thereof to said first web, so that said "L"-shaped section attached thereby extends in an individual plane essentially perpendicular to said first web; and a flexural forming surface pushing each said "L"-shaped section within said second plurality thereof from said second side of said strip, deforming in flexure said connecting portion attaching each said "L"-shaped section within said second plurality thereof until said second leg extends within said individual plane in a direction essentially parallel to said first web.

15. The apparatus of claim 14, wherein said flexural forming surface forms a part of said second die block.

16. The apparatus of claim 14, wherein said flexural forming surface forms a part of a third die block within a second forming station, which is displaced from said first forming station in said feed direction, with said strip being additionally fed from said first forming station to said second forming station.

17. The apparatus of claim 14, additionally comprising an insertion station into which said second plurality of "L"-shaped sections are fed, wherein said insertion station includes:

die surfaces trimming each said "L"-shaped section within said second plurality thereof from said first web by severing said connection portion attached thereto;

a receptacle block including a slot corresponding to each of said "L"-shaped sections in said second plurality thereof; wherein each said "L"-shaped section is inserted into said slot corresponding thereto after said connection portion attached thereto is severed; and insertion means for creating relative movement between said electronic package and said receptacle block to force each said tip portion of each said "L"-shaped section within said second plurality thereof into said electronic package.

18. The apparatus of claim 17:

wherein said receptacle block is disposed adjacent aid first side of said strip; and wherein said insertion means moves said receptacle block toward said electronic package in a direction parallel to a plane of said first web and perpendicular to said longitudinal direction.

19. The apparatus of claim 17, additionally comprising means for moving said electronic package between a first position, in which "L"-shaped terminals in said second plurality thereof are inserted, and a second position, in which "L"-shaped terminals in a third plurality thereof are inserted.

20. The apparatus of claim 19, wherein individual "L"-shaped sections within said third plurality thereof are inserted between individual "L"-shaped sections within said second plurality thereof.

21. The apparatus of claim 19, wherein said third plurality of "L"-shaped sections is inserted adjacent said second plurality thereof.

22. The apparatus of claim 14, comprising in addition a notching station having notching die surfaces separating a second web from said "L"-shaped sections within said second plurality thereof within said notching station, with said second web extending along a side of said strip opposite said first web.

23. Apparatus for inserting first and second rows of "L"-shaped structures within an electronic package, wherein said apparatus comprises first and second terminal processing stations and indexing means moving said electronic package between said first and second terminal processing stations, and wherein each said terminal processing station comprises:

feed means for feeding a strip in a feed direction parallel to said longitudinal direction, with motion of said strip being intermittently stopped, wherein said strip includes a first plurality of "L"-shaped sections, with each "L"-shaped section within said first plurality thereof being attached at a first end by a connecting portion to a first web extending in a longitudinal direction parallel to said feed direction as a portion of said strip, wherein each said "L"-shaped section includes a first leg extending at a first oblique angle relative to said longitudinal direction from said first end to an intersection point and a second leg extending at a second oblique angle relative to said longitudinal direction from said intersection point to a second end of said "L"-shaped section, wherein said "L"-shaped sections extend in a spaced-apart relationship, being arrayed in said longitudinal direction;

a first forming station engaging a second plurality of "L"-shaped sections within said first plurality thereof when said motion of said strip is intermittently stopped;

outer forming surfaces extending from a first die block within said first forming station, supporting each said "L"-shaped section within said second plurality thereof from a first side of said strip near said first and second ends of said "L"-shaped section;

central forming surfaces extending from a second die block within said first forming station, pushing each said "L"-shaped section within said second plurality thereof along said first and second legs thereof from a second side of said strip, opposite said first side thereof, as said "L"-shaped section is supported by said outer forming surfaces, twisting said connecting portion attaching each said "L"-shaped section within said second plurality thereof to said first web, so that said "L"-shaped section attached thereby extends in an individual plane essentially perpendicular to said first web;

a flexural forming surface pushing each said "L"-shaped section within said second plurality thereof from said second side of said strip, deforming in flexure said connecting portion attaching each said "L"-shaped section within said second plurality thereof until said second leg extends within said individual plane in a direction essentially parallel to said first web; and an insertion station into which said second plurality of "L"-shaped sections are fed, wherein said insertion station includes die surfaces trimming each said "L"-shaped section within said second plurality thereof from said first web by severing said connection portion attached thereto, a receptacle block including a slot corresponding to each of said "L"-shaped sections in said second plurality thereof; with each said "L"-shaped section being inserted into said slot corresponding thereto after said connection portion attached thereto is severed; and, insertion means for creating relative movement between said electronic package and said receptacle block to force each said tip portion of each said "L"-shaped section within said second plurality thereof into said electronic package.

24. The apparatus of claim 23, wherein, in each said terminal processing station:

said receptacle block is disposed adjacent said first side of said strip; and said insertion means moves said receptacle block toward said electronic package in a direction parallel to a plane of said first web and perpendicular to said longitudinal direction.

* * * * *